United States Patent Office 3,129,125
Patented Apr. 14, 1964

3,129,125
PREPARATION OF SILICON CARBIDE MATERIALS

Donald R. Hamilton, Monroeville, Pa., assignor to Westinghouse Electric Corporation, East Pittsburgh, Pa., a corporation of Pennsylvania No Drawing. Filed July 1, 1959, Ser. No. 824,190
5 Claims. (Cl. 148—174)

This invention relates to the preparation of materials useful in semiconductor devices. In particular the invention is concerned with the preparation of silicon carbide crystals that contain aluminum or boron as the predominant p-type conductivity determining impurity.

It is a major object of the present invention to provide an easily practiced method for preparing aluminum or boron-doped silicon carbide crystals with pretedmined concentrations of those materials at desired locations.

Semiconductor diodes may be considered as comprising three distinct regions. One is a p-type base region, and should be of relaively low resistivity to ensure an adequate supply of minority carriers. Another is an n-type region and contains a predominant density of donor impurities and is also of low resistivity. Between these two regions is a transition region in which the relative dominance of donor and acceptor densities must change from a predominance of acceptors to a predominance of donors, considering a direction from the p-type base to the n-type region.

P-type conductivity is provided in silicon carbide crystals in the present invention by aluminum or boron, known acceptor impurities. While aluminum or boron may be provided in silicon carbide crystals by using a charge containing those materials, or by introducing them into the crystal furnace from an external source, the former procedure is desirable for many reasons and it is that with which the present invention is concerned. Doping a crystal by means of a doped charge is indicated in this application as doping from an internal source, or a location from within the crystal furnace.

Where the acceptor impurity is provided from an internal source, it is evident that the acceptor density in the grown crystal will be largely uniform throughout tending to decrease only as the internal doping source is depleted. That has been confirmed by experimentation. Starting from that fact, it can be concluded that to accomplish a relative change in predominance of conductivity determining impurities in the transition region in a crystal in which the acceptor impurity is provided from an internal source, one need merely increase the relative quantity of the n-type, e.g. nitrogen, impurity present. This has been attempted and it was found that highly compensated n-type material, with consequent low carrier mobility, will result. Moreover, at the excessively high impurity density levels resulting, a strong possibility of impurity band conduction occurs. Neither impurity band conduction nor low mobility is a desirable phenomenon in diode structures.

In a semiconductor diode, the width of the transition region, and consequently the nature of the reverse characteristics of the resulting device, depends upon the rate of change of the relative densities of the donor and acceptor impurities present as well as at the rate of crystal growth. Altering the rate of crystal growth while it is growing can induce dislocations running through a junction, possibly resulting in electrically weak material, i.e. the junction be more prone to reverse breakdown. For this reason, among others, it is undesirable to control the transition region width by adjusting the crystal growth rate.

A suitable transition region can be on the order of a few microns thick. Silicon carbide can grow along the c-axis on an order of a micron per minute; therefore a five micron transition region could be grown in five minutes. It is evident that to provide a junction, rather rapid changes of doping impurity density are required.

With the foregoing considerations in mind, it can be concluded that it is highly desirable to effect a change in the relative density of the acceptor impurity in the transition region by functionally removing acceptor impurities from the crystal as it grows through the transition region. The present invention comprises a surprisingly simple and entirely unexpected manner of accomplishing that result. It has now been discovered that the desired change in the relative density of aluminum or boron acceptor impurities incorporated in a growing crystal from an internal source can be sharply altered by providing in the presence of the growing crystal a flowing atmosphere of a gas that is substantially inert to silicon carbide under the prevailing conditions of crystal growth. As a consequence of this step there results, functionally at least, a removal of aluminum or boron acceptors from the growing crystal, thereby effecting the intended acceptor density change. Since the flowing inert atmosphere is gaseous and can readily be supplied from an external source, acceptor density can be adjusted substantially at will merely by flowing such a gas through the growth zone at a predetermined time and for the predetermined period during which the density change is desired.

In practicing this invention the inert gas is metered to the crystal growth area at the time the transition zone is being formed. The amount and rate of gas flow used is, of course, dependent, upon the desired characteristics of the transition zone to be produced. However, where crystals are grown as in the examples which follow at a temperature within the range of about 2450° to 2600° C. and a transition zone of about five microns is desired, it has been found that a gas flow of about 20 to 100 cubic centimeters per minute, measured at atmospheric pressure, brings about a sharp change in acceptor density in the crystal grown during that period.

A gas is an inert gas in accordance with the meaning intended in the present invention when that gas is substantially free from conductivity determining impurities and is not significantly reactive with silicon carbide under the conditions occurring in crystal growth. Typical examples of gases that can be used include chlorine, fluorine, argon, hydrogen, helium and carbon monoxide as well as mixtures of such gases. Several of these gases are reactive with silicon carbide at the elevated temperatures involved. By using them in small amounts or in low concentrations, as in admixture with a truly inert gas, e.g. argon, they become functionally inert for present purposes and can be used in my process. It is believed that the action of the gases in causing the intended decreased aluminum or boron concentration is both physical and chemical. However, it is preferred that a gas chemically reactive with aluminum or boron be used. Chlorine is the preferred gas; particularly satisfactory results have been obtained using a gas mixture composed of equal parts of chlorine and argon.

Crystals may be grown for purposes of the present invention in accordance with the methods and apparatus described by Lely in his Patent No. 2,854,364 and in the co-pending application of Chang and Kroko, Serial No. 738,806, filed May 29, 1958. Reference may be made to those sources for details of known methods of growing silicon carbide crystals. In practicing the present invention, the raw material charge is provided with aluminum or boron in an amount sufficient to be the dominant conductivity determining impurity in the resulting crystal. Aluminum or boron doped silicon carbide, silicon-carbon mixtures in which the silicon contains aluminum or boron as an impurity, and mixtures of the pure elements to which aluminum or boron or their compounds have been deliberately added can be used for that purpose. An aluminum or boron concentration in the charge on the order of one-half to one and one-half weight percent generally is satisfactory to result in a sufficient concentration in the crystal to produce p-type material. When compounds such, for example, as aluminum oxide, boron oxide or the like are used to provide the desired impurity for doping purposes, losses of the impurity during the initial heating of the furnace are minimized.

To cause a change in concentration of the acceptor impurity in a predetermined portion of a crystal in accordance with the present invention, it must be known or determinable when that portion of the crystal is growing. That can be determined satisfactorily by running preliminary tests or growth runs under conditions identical, as nearly as is practical, to those to be used when producing the crystals as in this invention. A study of the resulting crystals will show their rate of growth as related to the conditions of the furnace at any given time.

The invention will be described further in conjunction with the following example in which the details are given by way of illustration and are not to be construed as limiting on the invention.

*Example*

The raw material charge was composed of commercially pure graphite and silicon. Analysis of the silicon showed that it contained 0.79 weight percent of aluminum, an amount known through experience to be sufficient to result in about 0.7 ohm cm. p-type material. This was placed in a graphite crucible and arranged in the conventional manner so that a hollow space was defined within the raw material charge. The graphite crucible had an outside diameter of 3¾ inches and was 6 inches high. After furnace evacuation, argon at atmospheric pressure was admitted. Then the furnace temperature was rapidly raised to 2450° C. After 1½ hours at these conditions, during which a silicon carbide vapor was produced and silicon carbide crystals doped with aluminum nucleated and grew, 20 cubic centimeters per minute each of chlorine and argon in admixture were admitted into the region of growth. This was accomplished by admitting these gases through a graphite tube that extended to within about one inch of the bottom of the crucible. Hence the gases were deflected by the bottom of the crucible and flowed upwardly around it in an annular space between the crucible and a furnace liner that surrounded the crucible; the space between the crucible and liner was approximately ⅛ inch. After an hour at these conditions, the furnace was permitted to cool to room temperature. The resulting crystals were examined by optical and electrical methods and it was found that a sharp decrease in aluminum concentration occurred in that portion of the crystals grown after the chlorine and argon mixture was admitted to the furnace.

From the foregoing example, it is readily apparent that this invention provides a convenient and easily practiced method of decreasing the aluminum concentration resulting in crystals grown wherein aluminum is supplied from a source within the crystal furnace. While a mixture of chlorine and argon was used, other gases may be used with analogous results. The rate of flow of gases in accordance with this invention depends on the conditions of operation, the furnace geometry, the point at which the gases are admitted, the temperature of the gases as well as their nature and similar considerations. With the foregoing guide, the artisan will be able to determine suitable flow rates to practice the invention under such other conditions as suits his convenience.

In another series of runs conducted as in the example above, the nitrogen content of the system was adjusted upwardly to about five volume percent at the time the flowing stream of chlorine and argon was admitted. Three runs were conducted in that manner. In a fourth run the nitrogen content was raised beyond the five percent level after a five minute period of operation with the chlorine gas present. The crystals obtained in all runs were examined under the microscope. In the first three runs, crystals were grown that contained transitions which appeared relatively sharp and distinct. In the fourth run crystals were grown that displayed a sharp decrease in the concentration of aluminum followed by a region of low optical absorption. Beyond that, an absorption characteristic of the gradually increasing nitrogen content was observed. The reverse characteristics of crystals of all runs were moderately good; a few crystals were found with reverse breakdowns in the region of 80 to 140 volts peak.

As is apparent to the artisan, the crystals produced in the foregoing runs are of the n-p-n type. One of the n areas must be removed to provide a suitable rectifying device. The crystals produced can be used in place of silicon and germanium devices now commercially available, but with the advantage of being capable of operating at far higher temperatures.

In accordance with the provisions of the patent statutes, the principle of the present invention has been explained and there has been described what is now believed to be its best embodiment. However, it should be understood that the invention can be practiced otherwise than as specifically described.

I claim:

1. In a method of preparing silicon carbide single crystals containing an element selected from the group consisting of aluminum and boron as the significant, p-type conductivity determining impurity in a portion thereof, in which a raw material charge containing said element is heated to a temperature sufficient to produce a vapor of silicon carbide and p-type doped silicon carbide crystals having a high concentration of the p-type doping impurity nucleate and grow therefrom, the step of decreasing the concentration of p-type impurity present in a predetermined subsequently grown portion of the crystals being so produced comprising flowing an inert gas comprising chlorine into the area of crystal growth at the time said predetermined portion of said crystals is growing whereby the concentration of the p-type element in the subsequent portion is reduced.

2. In a method of preparing silicon carbide single crystals containing an element selected from the group consisting of aluminum and boron as the significant p-type conductivity determining impurity in a portion thereof and an n-type material as the significant conductivity determining impurity in a second portion of said crystals, in which a raw material charge containing said element is heated in an atmosphere of an n-type impurity to a temperature sufficient to produce a vapor of silicon carbide and p-type doped silicon carbide crystals that also contain said n-type impurity nucleate and grow therefrom, said p-type impurity being present in an amount sufficient to be the dominant conductivity determining impurity present in said crystals, the step of decreasing the concentration of said p-type impurity present in a predetermined subsequently grown portion of the crystals being produced comprising flowing an inert gas having a gaseous component reactive only with the p-type element into the area of crystal growth at the time said predetermined portion of said crystals is growing whereby the concentration of the p-type element is reduced in such subsequent portion.

3. A method in accordance with claim 2 in which said inert gas comprises a mixture of chlorine and argon.

4. In the method of preparing a single crystal of silicon carbide containing portions of different impurity semiconductivity doping, one being an element selected from the group consisting of aluminum and boron as the significant p-type conductivity impurity in a portion of the single crystal, the steps comprising heating a raw material charge containing silicon, carbon and said element to a temperature sufficient to produce a substantial vapor of silicon carbide whereby initially p-type doped silicon carbide single crystals nucleate and grow from the vapor at a point adjacent the charge, then at a predetermined time substantially reducing the concentration of the element in subsequently grown portions of the crystals by flowing a mixture of chlorine and argon gases into the area of crystal growth whereby such subsequently grown portions contain a materially lower concentration of the element therein.

5. In the method of preparing a single crystal of silicon carbide having one portion of p-type semiconductivity and another portion of n-type semiconductivity, the p-type semiconductivity resulting from a high concentration in said one portion of an element selected from the group consisting of aluminum and boron while the n-type semiconductivity results from a high concentration of nitrogen in said another portion, the steps comprising heating a raw material charge containing silicon, carbon and said element to a temperature sufficient to produce a substantial vapor of silicon carbide whereby initially p-type doped single crystals of silicon carbide nucleate and grow, then at a predetermined time passing a gas comprising chlorine, argon and nitrogen into the area of crystal growth so that the concentration of the element in the subsequently grown portions of the single crystals is greatly reduced while the concentration of nitrogen is increased whereby the subsequently grown portions of the silicon carbide crystals have n-type semiconductivity.

References Cited in the file of this patent

UNITED STATES PATENTS

| | | |
|---|---|---|
| 2,854,364 | Lely | Sept. 30, 1958 |
| 2,918,396 | Hall | Dec. 22, 1959 |